United States Patent [19]
Larkin

[11] 4,224,583
[45] Sep. 23, 1980

[54] LINEAR RF ATTENUATOR

[75] Inventor: Stephen J. Larkin, Palm Bay, Fla.

[73] Assignee: Raytheon Company, Lexington, Mass.

[21] Appl. No.: 964,559

[22] Filed: Nov. 29, 1978

[51] Int. Cl.$^2$ .............................................. H03H 7/24
[52] U.S. Cl. .................................... 333/100; 332/49; 332/52; 333/103.81 R
[58] Field of Search .................. 333/81 R, 81 A, 100, 333/103, 104, 131, 136; 307/264; 332/43 B, 49, 52; 323/74, 75 F, 80, 81

[56] References Cited

U.S. PATENT DOCUMENTS

| | | | |
|---|---|---|---|
| 3,518,585 | 6/1970 | Wilcox | 333/81 R |
| 3,713,037 | 1/1973 | Hopfer | 333/81 A |
| 3,846,724 | 11/1974 | Maier | 333/81 R |
| 4,019,160 | 4/1977 | Kam | 333/81 R |

FOREIGN PATENT DOCUMENTS 517964  6/1976  U.S.S.R. ................................ 333/81 R

Primary Examiner—Paul L. Gensler
Attorney, Agent, or Firm—Joseph D. Pannone; Milton D. Bartlett; William R. Clark

[57] ABSTRACT

A linear attenuator using a dc control current to change the rf resistance of PIN diodes in series and parallel with the load. As the control current changes, the rf resistance of the series diode varies inversely and the parallel diode varies directly providing attenuation which changes linearly as a function of the control current through the series diode.

5 Claims, 3 Drawing Figures

LINEAR RF ATTENUATOR

BACKGROUND OF THE INVENTION

It is known that there are many applications for attenuator circuits. One example of an application for such a circuit is a modulator wherein an rf input signal is selectively attenuated as a function of a control or modulating dc current to provide amplitude modulation.

It has been known that certain components such as, for example, PIN diodes, can exhibit the properties of a variable resistor at microwave frequencies which are too high for rectification to take place because of the relatively large recovery time of a fixed i (intrinsicly doped) layer. At zero or reverse bias, the i layer introduces a high resistance. Under forward bias, however, the injection and storage of carriers reduces the resistance of the i region according to $R_i=(20-50)/i^{0.88}$ ohms, where i is the forward dc bias current in milliamps. Some prior art attenuators have been designed using this knowledge with such components as PIN diodes and FET's to accomplish rf attenuation which is a function of the dc bias current through the component. Such circuits have also frequently utilized a constant dc current source to control the dc bias current. It is also noted that it is common in the prior art to use balanced mixers to provide rf attenuation in the design of modulators and complex modulators. A substantial disadvantage of both the prior PIN diode approach and the use of balanced mixers is that the circuits heretofore used exhibit a limited range of attenuation linearity for various dc bias currents. Typically, the range of linear response has been on the order of 30 db or less. There is still a need for a circuit that provides substantial linear attenuation for a dc bias current range of greater than 50 db.

SUMMARY OF THE INVENTION

The invention discloses an electrical circuit which provides rf signal attenuation response to a dc control current that is substantially linear over a wide dynamic range. For the purpose of this disclosure, wide dynamic range is defined to be greater than 50 db. An rf signal preferably in the frequency range from 10 megahertz to 100 megahertz and a dc control current are simultaneously input to a terminal of the circuit. First and second PIN diodes having identical electrodes connected, the opposite electrode of said first diode connected to the terminal in series and the opposite electrode of said second diode connected to dc ground in parallel provide a variable rf resistance that is a function of the dc control current. The output of the series and parallel diode combination is connected through a resistor to a voltage source to provide a constant dc source.

Preferably, a capacitor between the source of rf signal and the input terminal provides a dc block such that the sum of the dc currents from the source of dc control current and the parallel diode is equal to a constant current that flows through the resistor. The rf resistances of the series and parallel diodes therefore vary inversely.

Preferably, the rf resistance of a PIN diode substantially equals 20 divided by a dc current to the 0.88 power where the current is flowing from it cathode to its anode and is in the range from one microamp to 2000 microamps.

In application, the circuit preferably is part of a biphase amplitude modulator wherein the rf signal is input to the primary of an rf transformer. Preferably, a center tap in the secondary of the transformer is connected to a source of dc current control capable of providing positive or negative polarity dc current. A positive dc current causes the rf signal to be attenuated through a series and parallel PIN diode path connected to one of the transformer secondary outputs. A negative dc current causes the rf signal to be attenuated through a series and parallel PIN diode path connected to the opposite transformer secondary output. There is a phase difference between the two paths of 180°.

BRIEF DESCRIPTION OF THE DRAWINGS

The foregoing and other objects and advantages will be understood more fully in the following detailed description thereof with respect to the accompanying drawings wherein.

DESCRIPTION OF THE PREFERRED EMBODIMENT

Figure 1:
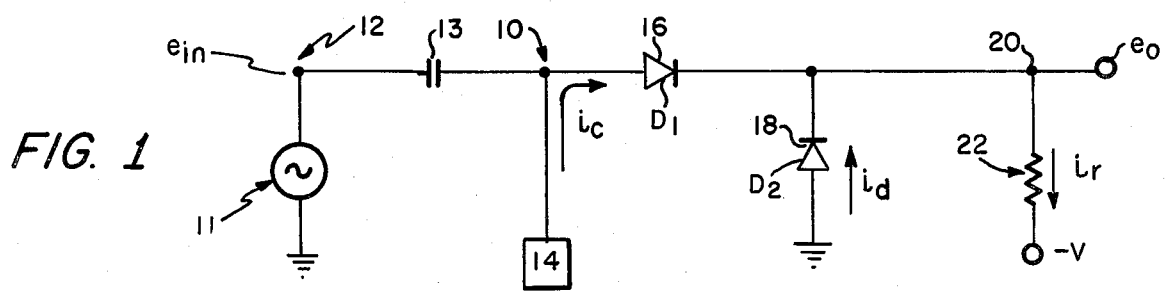
FIG. 1 is a schematic circuit diagram embodying the invention.

Referring to FIG. 1, a circuit schematic is shown that embodies the invention. Terminal 10 is adapted for coupling to a source 11 of rf input signal. The input signal, which generates an input voltage $e_{in}$ at terminal 12, is preferably in the frequency range from 10 megacycles to 100 megacycles and level range from −10 decibels above a milliwatt (dbm) to 0 dbm. The circuit can be optimized for different frequency and level ranges by selecting component values other than the ones identified hereinafter. In the reduction to practice of the preferred embodiment, a frequency input of 60 megacycles or 72 megacycles was used. Capacitor 13 blocks dc current from said source to the circuit but permits or is substantially transparent to the passage of rf signal in the frequency range identified above. In the preferred embodiment, a capacitance of 0.1 microfarads was used.

A variable constant current source 14 is connected to terminal 10 and delivers a dc control current, $i_c$, as shown in FIG. 1. Any conventional circuit may be used for this dc current source and preferably it selectively delivers current in the range from one microamp to 1,000 microamps dc. When the application of the circuit of FIG. 1 is an amplitude modulator, source 14 is preferably a conventional voltage to current converter that provides a dc current that tracks a voltage input to the converter that represents the desired modulation waveform. As discussed hereinafter, the rf attenuation of the circuit as shown in FIG. 1 is substantially a function of the control current, $i_c$, and can be considered linear over a range greater than 50 db.

Still referring to FIG. 1, PIN diodes 16 (D1) and 18 (D2) are connected as shown. More specifically, the anode of diode 16 is connected to terminal 12, the cathodes of diodes 16 and 18 are connected together and to terminal 20 which may be considered the output voltage $e_0$, and the anode of diode 18 is grounded. For reasons hereinafter discussed, the rf resistance in ohms of each PIN diode is preferably given by the equation:

$$R_{rf} = 20i^{-0.88} \quad (1)$$

where i is the forward dc current in milliamps. In the preferred embodiment for example, Hewlett-Packard 5082-3003 PIN diodes were used. The manufacture predicts the rf resistance of these components to be given by the equation:

$$R_{rf} = KI_D^x \quad (2)$$

where K is a constant in the range from 16 to 24, $I_D$ is the dc forward current through the diode in milliamps and x is the range from $-0.86$ to $-0.90$. Eight PIN diodes were tested in the lab and it was determined that they substantially conformed to these specifications and more specifically to equation (1) for a dc current range from 0 to 1000 microamps. The output terminal is connected through a large resistor 22 to a voltage source; the combination provides a constant current source of preferably two milliamps dc when resistor 22 is 10,000 ohms, V is $-20$ volts, and V is large with respect to $e_o$.

In analysis of the circuit shown in FIG. 1, the high resistance of resistor 22 substantially isolates it from the rf path. Accordingly, the rf circuit essentially comprises series and parallel diodes D1 and D2, and the attenuation is expressed by the equation:

$$A_{rf} = 20 \log \frac{R_{D2}}{R_{D1} + R_{D2}} \quad (3)$$

where $A_{rf}$ is attenuation in db, and $R_{D1}$ and $R_{D2}$ are the resistances of PIN diodes D1 and D2, respectively. Given that $i_r$ as shown in FIG. 1 is substantially constant at two milliamps dc, and that the control current $i_c$ is less than or equal to $i_r$, the sum of $i_c$ and $i_d$ equals $i_r$ expressed by the equation:

$$i_d = i_r - i_c \quad (4)$$

Referring to equations (1) and (4), it is shown that as the control current $i_c$ changes, the rf resistance of D1 varies inversely and D2 varies directly. Combining equations (1), (3), and (4), and simplifying, yields the equation:

$$A_{rf} = 20 \log \frac{i_c^{.88}}{i_c^{.88} + (i_r - i_c)^{.88}} \quad (5)$$

Figure 2:
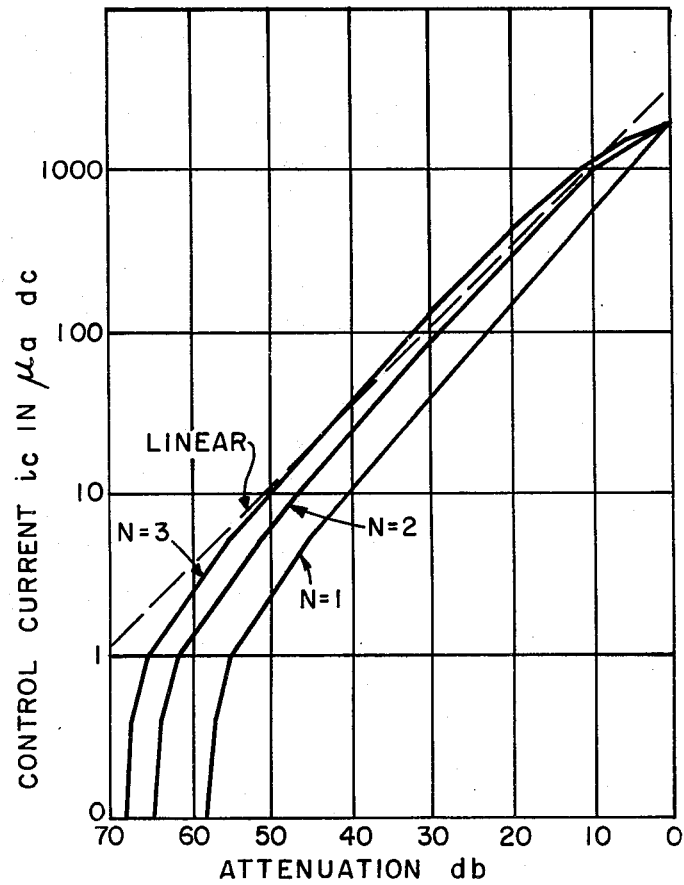
FIG. 2 is a plot of attenuation versus control current which shows the linearity of the circuit of FIG. 1.

Referring to FIG. 2, three plots identified as N equals 1, 2 and 3 are shown. These plots are from test data taken on the circuit in FIG. 1 where N is the number of series diodes. The addition of series diodes into the circuit increases the resistance and capacitance and alters the overall characteristics of the curves are plotted in FIG. 2. It is noted that the attenuation in db is plotted against the control current on a log scale so that the slope of a curve in addition to its shape becomes important in determining linearity. Accordingly, for reference in FIG. 2, a dashed line representing a linear plot is shown. As can be seen in FIG. 2, all three as measured plots are substantially linear over a dynamic range of greater than 50 db. It is further noted that the as measured data closely conforms to theoretical data obtained by substituting the control current $i_c$ as specified and having $i_r$ equal to 2 milliamps.

Figure 3:
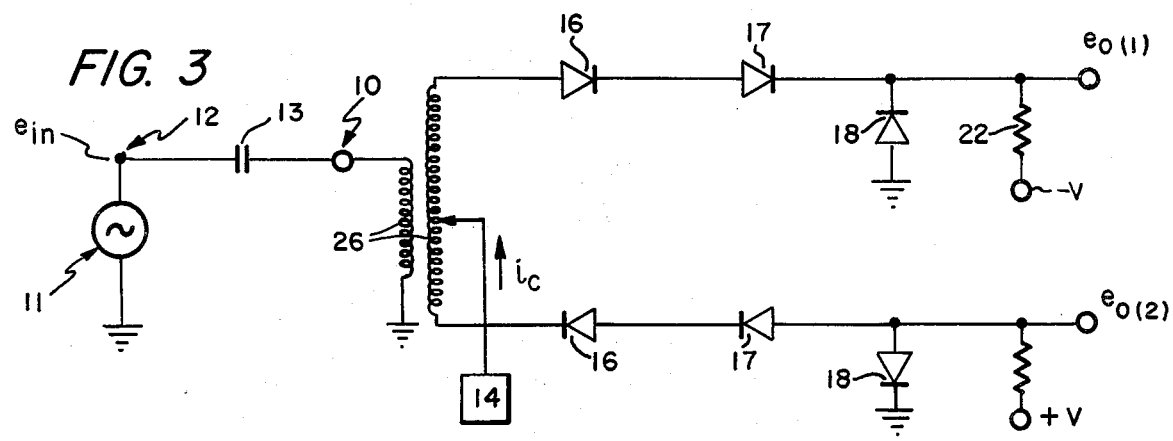
FIG. 3 is a schematic circuit diagram which is an alternative embodiment and application of the circuit in FIG. 1.

Referring to FIG. 3, an alternate embodiment and application of the inventive circuit as shown. As described with reference to FIG. 1, an rf signal preferably in the frequency range from 10 megacycles to 100 megacycles is generated at a source 11 and fed through a capacitor 13 operating as a dc blocking filter to a terminal 10 adapted for coupling said signal to the circuit discussed hereinafter. Terminal 10 is connected to a conventional rf transformer 26, the secondary of which is center tapped and fed by a constant dc control current, $i_c$, from source 14. When the dc current supplied by source 14 is positive, it flows through the top path as shown in FIG. 3 and this path functions according to the description given with reference to FIG. 1. Specifically, the output signal $e_{0(1)}$ is in phase with $e_{in}$ and attenuated as a substantially linear function of the control current $i_c$. Note that two PIN diodes 16 and 17 are in series. Further, when $i_c$ is positive, the rf resistance of the bottom path as shown in FIG. 3 is very high and substantially no rf output is present at $e_{0(2)}$. However, when $i_c$ is negative, dc current flows through said bottom path and it functions similar to the description given with respect to FIG. 1; the difference is that because of the transformer, the output $e_{0(2)}$ is 180° out of phase from $e_{in}$. Accordingly, if outputs $e_{0(1)}$ and $e_{0(2)}$ are summed by conventional circuitry, the magnitude of $i_c$ will determine the amplitude of the summed output (not shown) and the polarity of $i_c$ will determine the phase. The circuit heretofore described is an rf biphase amplitude modulator which has many applications such as, for example, a part of a circuit of a complex amplitude modulator for sidelobe canceling in radar processing. The discussion of components with respect to FIG. 1 is applicable to FIG. 3.

The reading of this disclosure by those skilled in the art will lead to various modifications and alternations without departing from the spirit and scope of the invention as defined in the appended claims. It is intended, therefore, that the embodiments shown and described be considered as exemplary only and that the scope of the invention be limited only by the appended claims.

What is claimed is:
1. In combination:
 a terminal adapted for connecting to a source of rf signal;
 an rf transformer having the primary side connected to said terminal;
 said rf transformer having a center tap on its secondary side adapted for coupling to a source of dc control current;
 a first PIN diode having its anode connected to a first secondary side of said transformer;
 a second PIN diode having its anode connected to dc ground and its cathode connected to the cathode of said first PIN diode;
 a source of negative voltage connected through a first resistor to said cathode of said first PIN diode;
 a third PIN diode having its cathode connected to a second secondary side of said transformer;
 a fourth PIN diode having its cathode connected to dc ground and its anode connected to the anode of said third PIN diode; and
 a source of positive voltage connected through a second resistor to said anode of said third PIN diode.

2. The combination in accordance with claim 1 wherein the impedance of said first and second PIN diodes is approximately $20i^{-0.88}$ where i is the forward DC current in milliamps and i is in the range from 0 to 1,000 microamps.

3. The combination in accordance with claim 1 wherein the resistance of said first and second resistors is greater than 5,000 ohms.

4. The combination in accordance with claim 1 wherein said negative voltage is equal to or more negative than −20 volts.

5. The combination in accordance with claim 1 wherein said positive voltage is equal to or more positive than +20 volts.

* * * * *